United States Patent [19]

Johnescu et al.

[11] Patent Number: 4,659,156
[45] Date of Patent: Apr. 21, 1987

[54] COAXIAL CONNECTOR WITH CIRCUIT BOARD MOUNTING FEATURES

[75] Inventors: Douglas M. Johnescu, York; Erlon F. Johnson, Elizabethtown, both of Pa.

[73] Assignee: AMP Incorporated, Harrisburg, Pa.

[21] Appl. No.: 748,264

[22] Filed: Jun. 24, 1985

[51] Int. Cl.⁴ ............................................. H01K 1/00
[52] U.S. Cl. .................................... 339/17 C; 339/65; 339/177 R; 339/95 A
[58] Field of Search ............ 339/17 C, 17 LC, 217 R, 339/184 R, 184 M, 177 R, 177 E, 221 R, 221 M, 65, 217 R, 220 R, 95 R, 95 A

[56] References Cited

U.S. PATENT DOCUMENTS

| | | | |
|---|---|---|---|
| 3,493,916 | 2/1970 | Hansen | 339/17 LC |
| 4,008,941 | 2/1977 | Smith | 339/17 LC |
| 4,157,207 | 6/1979 | Robinson | 339/221 M |
| 4,225,209 | 9/1980 | Hughes | 339/17 LC |
| 4,296,991 | 10/1981 | Hughes et al. | 339/17 C |
| 4,359,258 | 11/1982 | Palecek et al. | 339/17 C |
| 4,435,031 | 3/1984 | Black et al. | 339/17 LC |
| 4,533,200 | 8/1985 | Wilson | 339/221 M |
| 4,548,453 | 10/1985 | Mummey et al. | 339/177 R |
| 4,609,242 | 9/1986 | Kemppainen | 339/177 R |

Primary Examiner—Gil Weidenfeld
Assistant Examiner—David Pirlot
Attorney, Agent, or Firm—Gerald K. Kita

[57] ABSTRACT

According to the invention an improved connector has a housing portion with a base for mounting on a printed circuit board, projecting mounting posts extend from the base, a conductive outer shell and a dielectric body are surrounded by the housing portion, a first conductive contact is carried by the dielectric body and projects from the outer shell and has a first contact portion projecting from the housing for insertion into a corresponding aperture of a printed circuit board, the outer shell has a second contact portion projecting from the housing for insertion into a corresponding aperture of a printed circuit board, the free ends of the mounting posts project outwardly further from the base of the housing than the free ends of the first and the second contact portions, and the connector is characterized in that; each mounting post has a taper toward the free end, and each contact portion has a taper toward the free end and with an apex of the taper that intersects a longitudinal edge of the corresponding contact portion and is aligned with a center line of a corresponding aperture of a printed circuit board.

6 Claims, 6 Drawing Figures

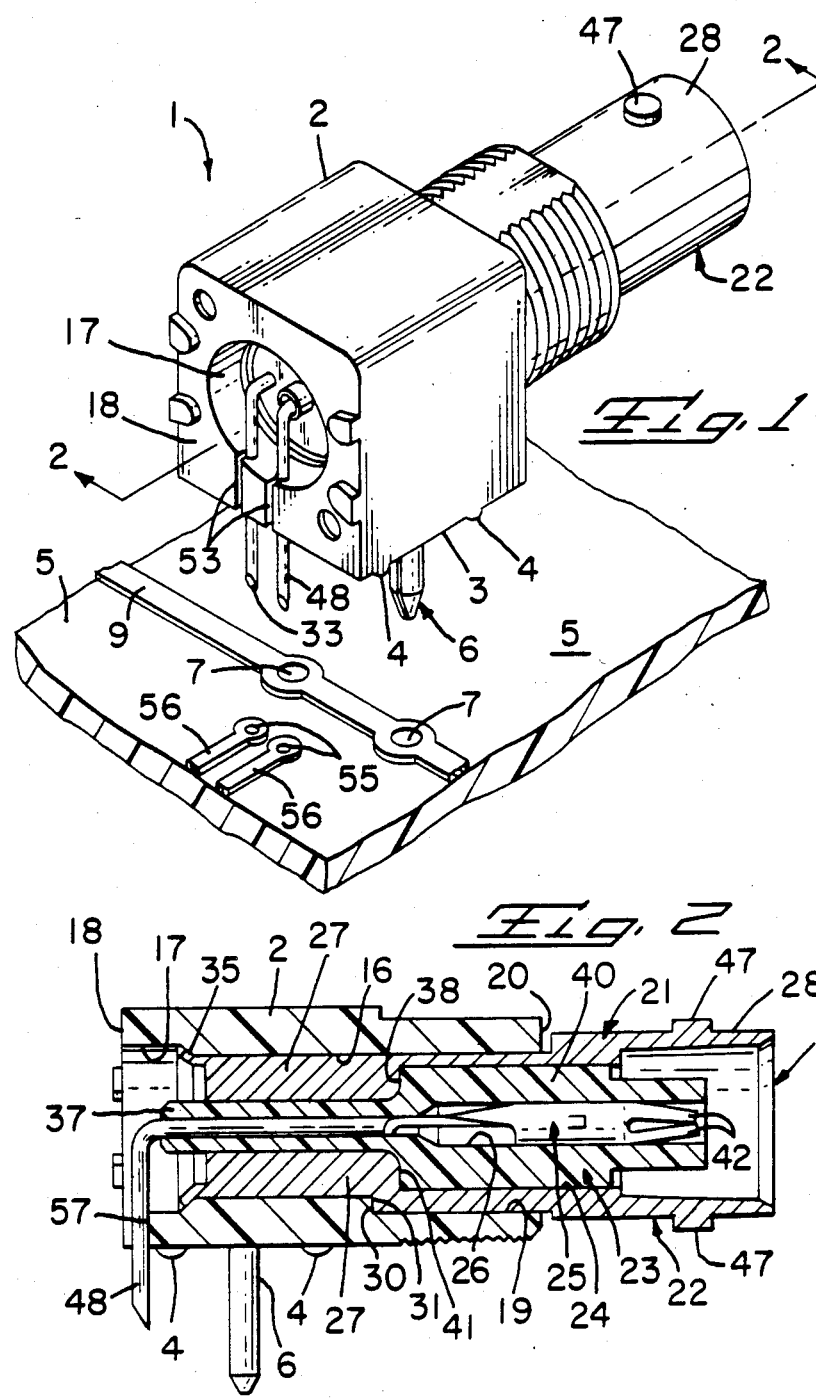

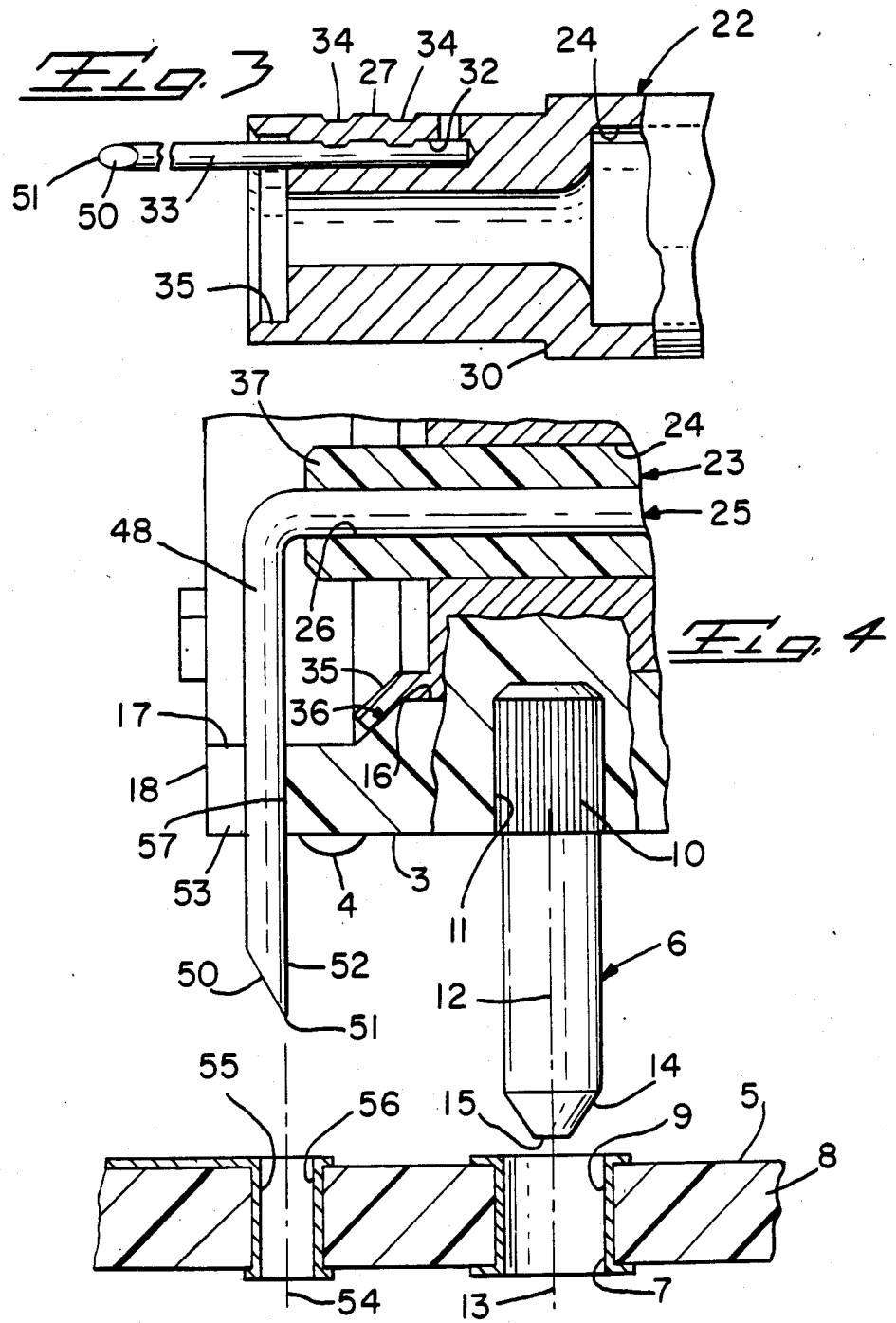

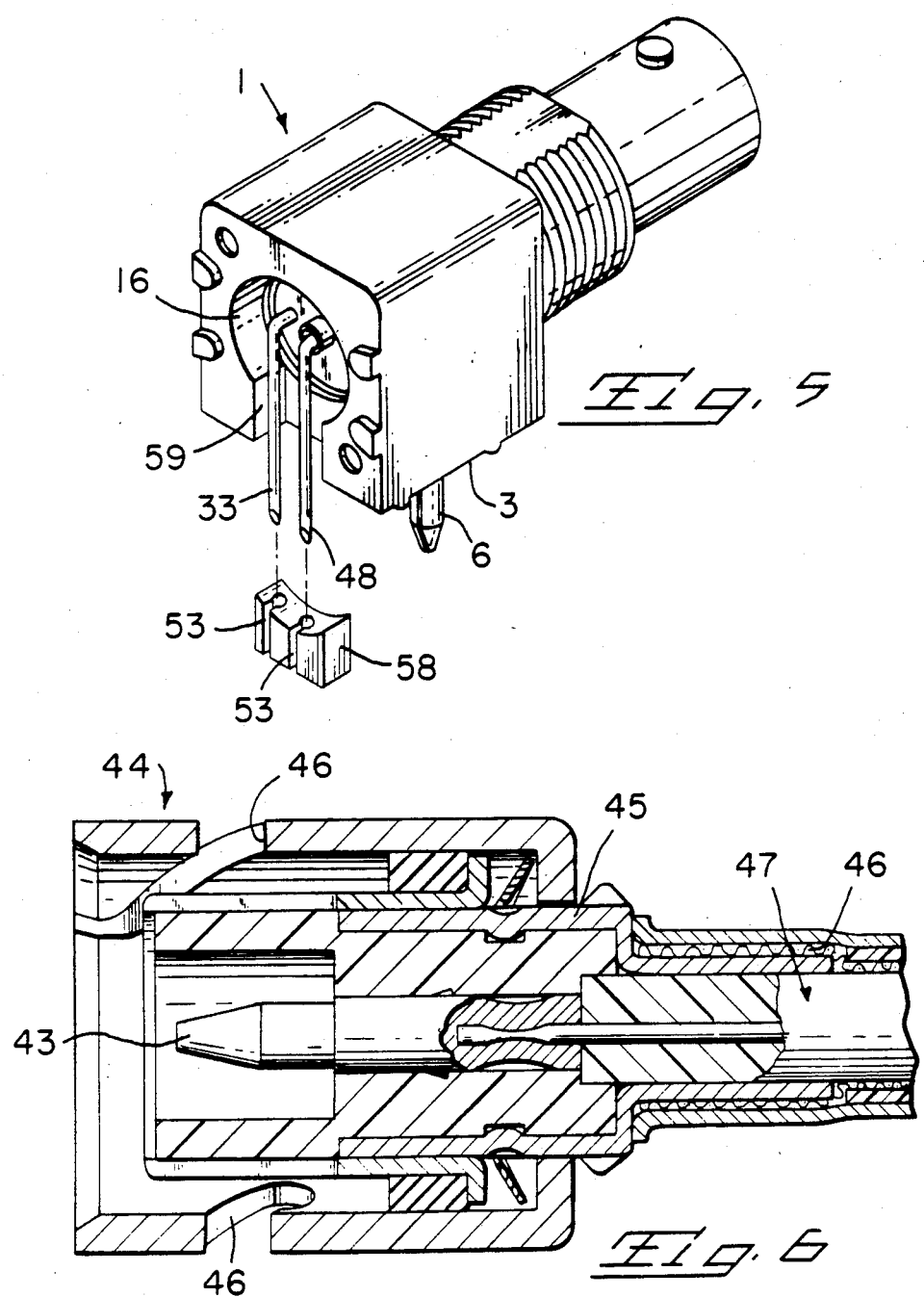

COAXIAL CONNECTOR WITH CIRCUIT BOARD MOUNTING FEATURES

The invention relates to an improved coaxial connector having projecting mounting posts and projecting electrical contact portions for connection in respective apertures of a printed circuit board.

BACKGROUND OF THE PRIOR ART

Projecting mounting posts and projecting contact portions on a prior electrical connector are known from the disclosure of U.S. Pat. No. 4,195,900. The contact portions are shorter than the mounting posts. The free ends of the mounting posts will register in respective apertures of a printed circuit board, while the shorter contact portions are spaced from the printed circuit board and are positioned in alignment with respective apertures. The contact portions are aligned and then inserted into the respective apertures. Fluent solder is applied to the contact portions to connect the contact portions to conductive circuits that are carried by the printed circuit board. Each mounting post is tapered toward its free end to provide a lead-in portion for ease of passage into a corresponding aperture.

The contacts are easily bent if they are misaligned with the axes of the apertures and the base of the connector is moved to engage the printed circuit board. Thus a person performing the assembly by hand must exercise skill and judgement to provide the mechanical accuracy necessary to align the contact portions with respective apertures. This hand assembly is a tedious operation that is suitably performed by automated machinery. Such machinery lacks the skill and judgement achieved in the performance of hand assembly and lacks the mechanical accuracy to align and insert the contact portions without bending them. Thus it is an advantage that the improved connector of the invention is provided with features that will increase the likelihood that the contact portions of the connector will be successfully assembled in apertures of a printed circuit board by machinery of limited capacity for mechanical accuracy.

SUMMARY OF THE INVENTION

According to the invention an improved connector has a housing portion with a base for mounting on a printed circuit board, projecting mounting posts extend from the base, a conductive outer shell and a dielectric body are surrounded by the housing portion, a first conductive contact is carried by the dielectric body and projects from the outer shell and has a first contact portion projecting from the housing for insertion into a corresponding aperture of a printed circuit board, the outer shell has a second contact portion projecting from the housing for insertion into a corresponding aperture of a printed circuit board, the free ends of the mounting posts project outwardly further from the base of the housing than the free ends of the first and the second contact portions, and the connector is characterised in that; each mounting post has a taper toward the free end, and each contact portion has a taper toward the free end and with an apex of the taper intersects a longitudinal edge of the corresponding contact portion and is aligned with a center line of a corresponding aperture of a printed circuit board.

An object of the invention is to provide an improved electrical connector which is suitable for mounting by machine in apertures of a printed circuit board.

Another object is to provide an improved electrical connector in which contact portions are in channels having contact supporting surfaces to align longitudinal edges of the contacts with centerlines of apertures in a printed circuit board.

Another object is to provide an improved connector in which contact portions have tapers toward respective free ends and the apecies of the tapers are aligned with longitudinal edges of the contact portions.

Further advantages of the invention are apparent from the detailed description which follows and from the drawings which are described as follows:

DESCRIPTION OF THE DRAWINGS

FIG. 1 of the drawings is a perspective view of an improved connector according to the invention and a portion of a printed circuit board with which the connector is to be assembled.

FIG. 2 is a section view of the improved connector and taken along the line 2—2 of FIG. 1.

FIG. 3 is an enlarged section view of a portion of the connector shown in FIG. 1.

FIG. 4 is an enlarged section view of a portion of the connector and the printed circuit board shown in FIG. 1, and with parts broken away to illustrate a mounting post of the connector.

FIG. 5 is a perspective view of another improved connector according to the invention and illustrating a portion of the connector in exploded configuration.

FIG. 6 is an enlarged cross sectional view of a known coaxial connector.

DESCRIPTION OF THE INVENTION

A detailed description of the invention follows with reference numerals in the detailed description shown in the drawings. FIGS. 1 through 4 show an improved connector 1 according to the invention. A housing 2 of the connector 1 is molded from dielectric material and has a base 3 and integral projection feet 4 on which the housing 2 stands when the base 3 is mounted on a printed circuit board 5.

The connector 1 has projecting mounting posts 6 of conductive metal for connection in respective apertures 7 through the thickness 8 of the printed circuit board 5. The apertures 7 are lined with metal plating and the plating also forms a conductive circuit 9 on the printed circuit board 5. As shown in FIG. 4, each mounting post 6 has a roughened end portion 10 that is frictionally retained with an interference fit within a corresponding recess 11 in the base 3. The longitudinal axis 12 of each mounting post is aligned with the centerline 13 of the corresponding aperture 7. Each mounting post 6 has a frusto-concial taper 14 toward the free end 15 and sloped at an angle of thirty-five degrees with the axis 12. The taper 14 and the alignment of the mounting post 6 with a corresponding aperture 7 facilitates registration of the post 6 in the aperture 7 by automated machinery, not shown.

The housing 2 has a bore 16 with an axis 17 parallel to the base 3. The bore 16 has an enlarged diameter end bore portion 17 communicating with a rearward end 18 of the housing 2, and an enlarged diameter end bore portion 19 communicating with a forward end 20 of the housing 2.

A coaxial connector assembly 21 is in the bore 16 and comprises a conductive outer shell 22 of stepped cylindrical form, a dielectric body 23 of insulative material within a hollow interior 24 of the outer shell 22 and a conductive center contact 25 within a stepped bore 26 of the dielectric body 23. A rearward end 27 of the outer shell 22 is of smaller diameter than the forward end 28 and is assembled in the bore 16 of the housing 2 from the forward end 29 of the housing 2. A shoulder 30 on the stepped diameter of the outer shell 22 engages a shoulder 31 at the intersection of the end bore portion 17 and the bore 16 of the housing 2 to limit movement of the outer shell 22 in a rearward direction. As shown in FIG. 3, the rearward end 27 of the outer shell 22 has a recess 32 in which is mounted an elongated and conductive electrical contact portion 33 that projects axially from the rearward end 27 of the outer shell 22 and from the rearward end 18 of the housing 2 that surrounds the outer shell 22 and the contact 33. The contact portion 33 is secured in place by applying compression on the outer shell 22 and causing two indentations 34 of the outer shell 22 and partial collapse of the outer shell 22 in compression engagement against the contact portion 33. A skirt 35 on the rearward end 27 is then flared radially outward to engage a shoulder 36 at the intersection of the end bore portion 17 and the bore 16 of the housing 2 to limit movement of the outer shell 22 in a forward direction.

A smaller diameter rearward end 37 of the dielectric body 23 is inserted in and along the open forward end 28 of the outer shell 22 and projects outwardly of the rearward end 27 of the outer shell 22 to be surrounded by the outer housing 2. A shoulder 38 on the forward end 40 of larger diameter of the dielectric body 23 engages a shoulder 41 in the bore 16 of the outer shell 22 to limit movement of the dielectric body 23 in a rearward direction.

The center contact 25 has a forward portion in the form of resilient fingers 42 for electrical connection and coupling to a center contact 43 of a known coaxial connector 44. The known coaxial connector 44 has an outer shell 45 for electrical connection and coupling to the outer shell 22 and a slotted portion 46 for coupling to the external projections 47 of the housing 2. The outer shell 45 is connected to a conductive jacket 46 of a coaxial cable 47, and the inner contact 43 is connected to the center conductor of the cable 47. Further details of the known coaxial connector 44 and the cable 47 are disclosed in U.S. Pat. No. 4,165,911 issued Aug. 28, 1979. The center contact 25 has a rearward extending and elongated contact portion 48 which is inserted in and along the bore 26 of the dielectric body 23 and which projects outwardly of the rearward end 37 of the dielectric body 23 and the rearward end 18 of the housing 2. The contact portion 48 is secured to the forward portion, for example, by inserting the contact portion 48 within the forward portion and further by the application of compressive force to collapse the forward portion compressively to engage and grip the contact portion 48.

Each of the contact portions 33 and 48 has a corresponding taper 50 toward the corresponding free end. An apex 51 of the taper 50 at the free end intersects and is coincident with a longitudinal edge 52 of the corresponding contact. As shown in FIGS. 1 and 4, the rearward end 18 of the housing 2 is provided with channels 53 aligned with respective contact portions 33, 48 and communicating with the base 3 and the bore 16. The contact portions 33, 48 are bent toward the base 3 and are received in respective channels 53. The free ends of the contact portions 33, 48 project from the channels 53 and the base 3. The apecies 51 of the tapers 50 are in alignment with the centerlines 54 of respective apertures 55 through the thickness 8 of the printed circuit board 5. The apertures 55 are lined with conductive plating and the plating further forms conductive circuits 56 on the printed circuit board 5. The longitudinal edges 52 of the contact portions 33, 48 engage the bottom walls 57 of the channels 53 which also are aligned with the centerlines 54 of the respective apertures 55.

The connector 1 is advantageously suited for assembly in apertures 7, 55 of the printed circuit board 5 by machinery, not shown. The longer mounting posts 6 are placed in registry with corresponding apertures 7, while the shorter contact portions 33, 48 are spaced from the printed circuit board 5 and are less likely to be damaged by engagement with the printed circuit board 5. The thirty-five degree taper 14 on the mounting posts 6 provide the desired sharpness for ease of registry with the apertures 7. The mounting posts 6 are larger in diameter than the contact portions 33, 48. The larger diameter apertures 7 for the mounting posts 6 are easier to locate than the smaller apertures 55 for the contact portions 33, 48. Once the mounting posts 6 are located in their apertures 7, the mounting posts 6 will align the contact portions 33, 48 with the corresponding apertures 55. Any inaccuracies in alignment of the contact portions 33, 48 with the apertures 55 are compensated for by the longitudinal edges 52, the bottom walls 57 of the channels 53 and the apecies 51, all in alignment with the centerlines 54 of the apertures 55 and cooperating to align the contact portions 33, 48 with the apertures 55. Thus it is an advantage that the improved connector 1 of the invention is provided with features that will increase the likelihood that the contact portions 33, 48 of the connector 1 will be successfully assembled in apertures 55 of a printed circuit board 5 by machinery of limited capacity for mechanical accuracy.

An alternative connector 1 is shown in FIG. 5. The alternative connector 1 is similar to the connector 1, with the exception that the housing 2 of the alternative connector 1 is conductive. The housing portion 58 of the alternative connector having channels 53 which receive the contact portions 33, 48 is a separate body of insulative material that is received in a recess 59 in the rearward end 18 of the housing 2 and communicates with the bore 16 and the base 3.

What is claimed is:

1. An improved connector having a housing portion with a base for mounting on a printed circuit board, projecting mounting posts extend from the base, a conductive outer shell and a dielectric body are surrounded by the housing portion, a first conductive contact is carried by the dielectric body and projects from the outer shell and has a first contact portion projecting from the housing for insertion into a corresponding aperture of a printed circuit board, the outer shell has a second contact portion projecting from the housing for insertion into a corresponding aperture of a printed circuit board, the free ends of the mounting posts project outwardly further from the base of the housing than the free ends of the first and the second contact portions, and the connector is characterised in that; each mounting post has a taper toward the free end, and each contact portion has a taper toward the free end and with an apex of the taper that intersects a longitudinal external edge of the corresponding contact portion and is aligned with a center line of a corresponding aperture of a printed circuit board, channels extend in the housing and contact supporting surfaces are in the channels, the first and second contact portions are in corresponding channels and the longitudinal external edges of the contacts intersected by the respective tapers engage the contact supporting surfaces of corresponding channels, the contact supporting surfaces of the channels are aligned with center lines of respective apertures in the printed circuit board, whereby upon registration of the free ends of the first and second contact portions with the contact supporting surfaces, colinear alignment of the corresponding apecies, longitudinal external edges and contact supporting surfaces results.

2. The improved connector as recited in claim 1, wherein the contact supporting surfaces intersect the base.

3. The improved connector as recited in claim 1 or 2, wherein the housing is conductive and has an insulative portion adjacent the base, and the contact portions are retained by the insulative portion.

4. The improved connector as recited in claim 1 or 2, wherein the longitudinal axis of each mounting post is aligned with the axis of a corresponding aperture of the printed circuit board.

5. The improved connector as recited in claim 1 or 2, wherein the mounting posts are metal and are frictionally inserted in recesses in the housing.

6. The improved connector as recited in claim 1 or 2, wherein the mounting posts have roughened portions frictionally engaged in the housing.

* * * * *